(12) United States Patent
Grigaliunas et al.

(10) Patent No.: US 11,846,888 B2
(45) Date of Patent: Dec. 19, 2023

(54) FABRICATION METHOD OF HOLOGRAPHIC SECURITY LABEL

(71) Applicant: Kaunas University of Technology, Kaunas (LT)

(72) Inventors: Viktoras Grigaliunas, Kaunas (LT); Sigitas Tamulevicius, Kaunas (LT); Mindaugas Andrulevicius, Kaunas (LT); Tomas Tamulevicius, Kauno raj. (LT); Egle Fataraite-Urboniene, Kaunas (LT); Pranas Narmontas, Kaunas (LT); Tomas Klinavicius, Kaunas (LT); Dalius Jucius, Kaunas (LT); Mindaugas Juodenas, Kaunas (LT)

(73) Assignee: Kaunas University of Technology, Kaunas (LT)

( * ) Notice: Subject to any disclaimer, the term of this patent is extended or adjusted under 35 U.S.C. 154(b) by 315 days.

(21) Appl. No.: 17/178,281

(22) Filed: Feb. 18, 2021

(65) Prior Publication Data
US 2021/0318621 A1   Oct. 14, 2021

(30) Foreign Application Priority Data
Apr. 13, 2020  (EP) .................................. 20169233

(51) Int. Cl.
*B42D 25/29*    (2014.01)
*B42D 25/328*   (2014.01)
(Continued)

(52) U.S. Cl.
CPC ........... *G03F 7/7035* (2013.01); *B42D 25/29* (2014.10); *B42D 25/328* (2014.10);
(Continued)

(58) Field of Classification Search
CPC ........ G03H 5/00; G03H 1/0276; G03H 1/028; G03H 2001/0296; G02B 6/12007;
(Continued)

(56) References Cited

U.S. PATENT DOCUMENTS

| 4,215,288 A | * | 7/1980 | Kato | ...................... H01J 29/41 313/394 |
| 5,393,634 A | | 2/1995 | Maker | |

(Continued)

FOREIGN PATENT DOCUMENTS

| EP | 0602829 | 6/1994 | | |
| WO | WO-03050877 A1 | * | 6/2003 | ............. B82Y 10/00 |
| WO | WO-2019180460 A1 | * | 9/2019 | ............. B42D 25/29 |

OTHER PUBLICATIONS

Viktoras Grigaliunas et al. "Microlens fabrication by 3D electron beam lithography combined with thermal reflow technique". Microelectronics Engineering, vol. 164, pp. 23-29, XP029704333, 2016.
(Continued)

*Primary Examiner* — Jennifer D. Carruth
*Assistant Examiner* — Jyotsna V Dabbi
(74) *Attorney, Agent, or Firm* — Meunier Carlin & Curfman LLC

(57) ABSTRACT

Disclosed herein is a method that combines two different hologram origination processes in a single photoresist layer by using an interlayer to transfer structures exposed by electron beam lithography into overlapped with dot-matrix hologram areas, and fabricated holographic structures are replicated in multilayer polymer films. Dot-matrix technique is low cost process, which has high origination speed and can be used for the patterning of large areas of holograms with high diffraction efficiency. Electron beam lithography allows the formation of high resolution structures. The method allows combining these two technologies so that the final security device could contain electron beam patterned
(Continued)

high resolution diffraction gratings, computer generated holograms, as well as dot-matrix laser patterned large hologram areas with high diffraction efficiency, providing an increased level of protection.

3 Claims, 7 Drawing Sheets

(51) Int. Cl.
    *G03H 1/00*     (2006.01)
    *G02B 6/12*     (2006.01)
    *G03F 7/00*     (2006.01)
    *G03F 7/20*     (2006.01)

(52) U.S. Cl.
    CPC ....... *G02B 6/12007* (2013.01); *G03F 7/2059* (2013.01); *G03H 1/0011* (2013.01)

(58) Field of Classification Search
    CPC ..... G03F 7/7035; G03F 7/2059; B42D 25/29; B42D 25/328; B42D 15/02
    USPC ................................. 359/2; 216/94
    See application file for complete search history.

(56) References Cited

U.S. PATENT DOCUMENTS

| 6,392,768 | B1 | 5/2002 | Yeh et al. |
| 7,435,979 | B2 | 10/2008 | Ryzi et al. |
| 8,625,181 | B2 | 1/2014 | Holmes |
| 2009/0004571 | A1* | 1/2009 | Holmes ................. B42D 25/29 430/312 |

OTHER PUBLICATIONS

Arvydas Palevicius et al. "Development of complex 3D microstructures based on computer generated holography and their usage for biomedical applications". Proceedings of SPIE, vol. 9802. 2016.

* cited by examiner

FABRICATION METHOD OF HOLOGRAPHIC SECURITY LABEL

TECHNICAL FIELD

The invention relates to manufacturing method of security holograms and in particular method of combining diffractive images into a single product.

BACKGROUND ART

Security holograms are widely used for protection against counterfeiting of documents, banknotes, credit cards, trademarks, product packaging, sealing, transportation tickets, software, etc., as holograms are made using very expensive and sophisticated technologies that are difficult to access for potential counterfeiters. Recently, however, a number of manufacturers of holograms and other optically variable devices has considerably expanded, and potentially various manufacturers may produce analogous holograms. So, more expensive and unique technologies or combinations of them need to be used in order to maintain a high level of protection against counterfeiting.

European patent application No. 93309585.3 (publication number EP0602829) discloses a method for producing arbitrary gratings by writing a pattern by electron beam process and subsequently using it as a phase mask to transfer it to a device. The electron beam defined pattern is etched into a mask substrate using reactive ion etching. By proper choice of depth, transmitted and diffracted beams can be made to be of equal intensity. Therefore, such substrate can be used as a pure phase mask for near-field grating printing. The advantage of this method is the freedom to define arbitrary gratings because of the flexibility of the electron beam writing technique; what is more, this process can be performed once, and the resulting mask can be reused multiple times. Authors also claim to have found that a filtered mercury arc lamp light, provided that it emanates from a small source and is collimated, can be used instead of a UV laser and sufficient interference contrast can be achieved using apparatus commonly found in most clean room environments. This method differs from ours because it does not involve dot-matrix grating formation using two-beam laser interference. Using a single e-beam lithography technique for imposing patterns results in homogeneous grating profile, which is easy to replicate.

U.S. Pat. No. 5,393,634 describes a method for creation of a transparent multilevel phase hologram at the same time having functionality of the amplitude holograms. The metalized optically transparent substrate is spin coated with an electron beam resist and then exposed with the desired drawing together with the alignment markers. Full dose exposure is used in order to be able to access the metal film after the development. After etching the metal, a phase mask is obtained. The resist is then stripped for the second spin coating with the electron beam resist. The multilevel phase mask is then recorded in the transparent resist controlling the doses via electron beam exposure aligned over the amplitude mask. The method of making the holograms using only electron beam lithography technique is relatively easier to counterfeit.

U.S. Pat. No. 6,392,768 describes a method for creation of dot-matrix hologram with hidden image. Method utilizes the principle of laser interference lithography to form a dot-matrix hologram with hidden image. There, a group of grating dots is formed as a rectangular basic block of grating dots. This basic block of grating dots is repeated to form a group of blocks of grating dots with a matrix arrangement to constitute the hidden image region of a hologram. Since the grating dots with identical pitch and angle may diffract the convergent laser light, the reconstructed position of the hidden image is independent on to the position of the illumination area of the hidden image region. The blocks of grating dots in the hidden image region are formed by two-dimensional duplication. In a general illumination, it will present a matrix type of images with the same dynamic effects simultaneously. Thus, using a dot-matrix hologram, dynamic effects with grating dots in different group being bright in turn can be created easily. A property of grating of each grating dot is precisely controlled to design specific conditions for incident light to be diffracted to specific positions to generate a specified hidden image. Because of this principle, not only the standard diffraction gratings of variable period and orientation can be formed in the graphic image, but also a hidden image that is visible on the screen under the light of a laser beam. The method describes using only dot-matrix laser interference lithography to form a hologram with a hidden image so a security device can be relatively easily counterfeited.

U.S. Pat. No. 7,435,979 describes a way to produce optical devices by continuously varying electron beam spot parameters and exposure time during electron beam lithography. They use a rectangular beam spot that can be changed during exposure independently in both Cartesian coordinates and rotated. The authors also claim a pre-processing technique of converting binary or grayscale bitmap images into machine code to produce various diffractive elements based on the input. The pre-processing algorithm can also take in an RGB bitmap image and reference each pixel to a library of different optical elements to be filled into pre-defined areas by electron beam lithography. The patent also describes several embodiments of producing switching image channels that can be viewed at different angles and/or orientations. This method of hologram production only uses electron beam lithography making the security device relatively easier to counterfeit.

Closest prior art is considered to be disclosed in European patent No. EP2152526 and U.S. patent application Ser. No. 12/451,094 (publication number US 2010/0172000) describing a method of forming a holographic security device. The essence of the method is to combine within the same resist master two precisely interleaved image generating structures exhibiting complementary optically variable effects—each having been fabricated within the resist by separate and technologically distinct origination methods, such as optical interferometry and electron beam lithography. Regions of one structure are interleaved with regions of the other on a scale which is non-visible to the naked eye such that the two structures appear fully integrated. Typical dimensions of the structure elements are from 5 to 50 microns. The first diffractive image generating structure characterised by a diffuse diffracting structure is typically generated by optical interferometry. The second generating structure characterised by a specular diffracting structure is typically generated using dot-matrix interferometry, lithographic interferometry or electron beam lithography. This produces a security device with visually distinctive optically variable image switching effect. The holographic images may be visible at different viewing angles and could present views of different objects or different views of the same object. Described method allows the creation of an optically variable device with two or more very clear and bright graphical overlapping holographic images located in the same area of the device but visible at different orientations.

The method of forming a holographic security device is comprised of providing an undeveloped photoresist layer on an electrically conductive Cr layer, forming a first diffractive image generating structure having a diffuse diffractive replay in the undeveloped photoresist layer, forming a second diffractive image generating structure having a specular replay in the undeveloped photoresist layer, and thereafter developing the photoresist layer. Thin Cr layer acts primarily as the conductive layer but may also act as an absorbing anti-reflection coating to suppress internal reflections within the resist plate. The drawback of the method is reduced positioning accuracy using optical alignment when combining electron beam and dot-matrix laser patterned regions. In our case, alignment of electron beam and dot-matrix patterning regions is done by scanning electron microscope in one resist layer ensuring very high positioning accuracy.

The present invention is dedicated to overcoming of the above shortcomings and for producing further advantages over prior art.

BRIEF DESCRIPTION OF INVENTION

The manufacturing method of a holographic security label according to the invention combines dot-matrix laser origination technique and electron beam lithography technique and replication of combined holograms in multilayer polymer films.

The dot-matrix laser origination technique is used for patterning of diffraction gratings with variable period and orientation. Dot-matrix technique is low cost process, which has high origination speed and can be used for the patterning of large areas of holograms with high diffraction efficiency, but due to optical limitations of this method it is not possible to create extremely high resolution structures.

The electron beam lithography technique is used for patterning of computer generated holograms and high resolution diffraction gratings. It allows the formation of high resolution structures, but origination speed is relatively low and the process cost is very high.

An intermediate aluminium layer is used to transfer the electron beam patterned structures into the photosensitive resist layer.

The method comprises exposing a defined design areas and alignment marks in photoresist on glass substrate by using a dot-matrix laser lithography machine ($\lambda$=405 nm), developing alignment marks, vacuum depositing the aluminium layer, spin coating of PMMA resist layer, high accuracy alignment of the dot-matrix laser and electron beam patterning areas by using scanning electron microscope, electron beam patterning, PMMA development, chemical etching of the aluminium film, photoresist exposure ($\lambda$=405 nm), removal of the aluminium layer, where PMMA layer is lift-offed as well, and final development of the photoresist fabricating dot-matrix laser and electron beam patterned areas at the same time. The developed resist is then used to produce a nickel stamp, and the produced stamp is then used for the multiple replication of the holograms in a multilayer metallized or transparent polymer film. Depending on the application purpose, a polymeric film with the imprinted holograms may be coated with pressure-sensitive, thermoplastic or thermosetting adhesive and divided into individual labels of the appropriate shape, providing an increased level of protection against counterfeiting.

The level of security of a security device is thus increased by combining precisely aligned dot-matrix laser and electron beam patterned areas into a single resist layer by using an aluminium interlayer. Rectangular and sinusoidal like profiles are present on a single hologram master. The production of combined holograms according to the method requires more precise control of replication parameters compared to known prior art.

BRIEF DESCRIPTION OF DRAWINGS

Features of the invention believed to be novel and inventive are set forth with particularity in the appended claims. The invention itself, however, may be best understood by reference to the following detailed description of the invention, which describes exemplary embodiments, given in non-restrictive examples, of the invention, taken in conjunction with the accompanying drawings, in which:

Preferred embodiments of the invention will be described herein below with reference to the drawings. Each figure contains the same numbering for the same or equivalent element.

DETAILED DESCRIPTION OF THE INVENTION

It should be understood that numerous specific details are presented in order to provide a complete and comprehensible description of the invention embodiment. However, the person skilled in art will understand that the embodiment examples do not limit the application of the invention which can be implemented without these specific instructions. Well-known methods, procedures and components have not been described in detail for the embodiment to avoid misleading. Furthermore, this description should not be considered to be constraining the invention to given embodiment examples but only as one of possible implementations of the invention.

ABBREVIATIONS USED

PMMA—Polymethylmethacrylate.
CGH—Computer Generated Hologram.
MIBK—methylisobuthilketone.
IPA—isopropyl alcohol.
PET— Polyethylene terephthalate FIGS. 1-10 show a method of producing an original hologram that allows the combination of dot-matrix laser and electron beam lithography techniques in a single resist layer using an aluminium interlayer.

Figure 18:
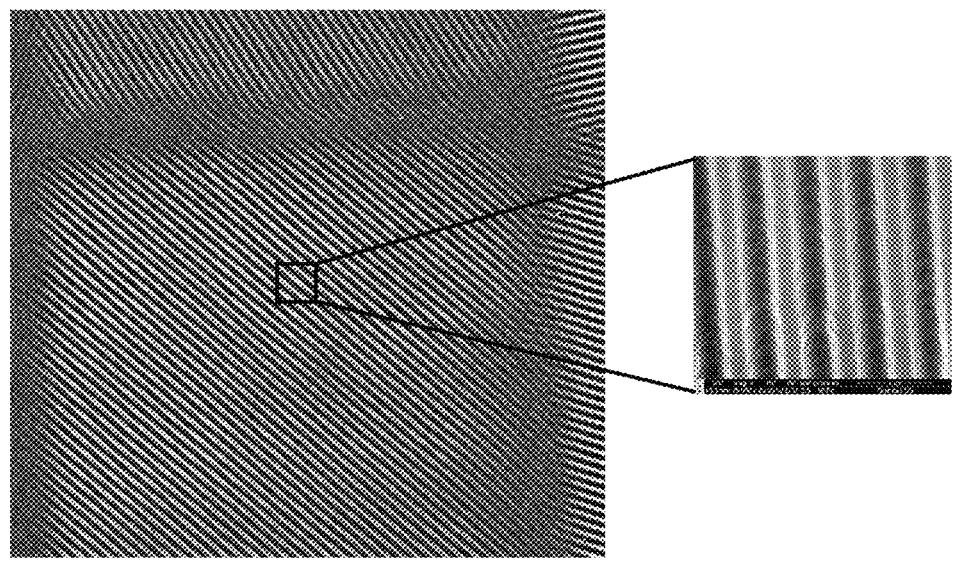
FIG. 18 shows a dot-matrix hologram comprising an array of grating dots formed by exposing designated photoresist areas to overlapping laser beams.

At first, patterns of dot-matrix hologram (3) and alignment marks (4) in defined areas of art design are formed in a photosensitive layer (2) on a glass substrate (1) by employing laser beam interference lithography method. A dot-matrix hologram comprising an array of grating dots, as shown in FIG. 18, is formed by exposing designated photoresist areas to overlapping laser beams. The appropriate position and grating orientation angle of each grating dot is controlled by X-Y motorized translation stage, laser beam splitter rotation stage and computer software. Development of the exposed photoresist areas with alignment marks on the far side of specimen (5) is done using a Microposit® MF-26A developer for 20 seconds at room temperature immersing only a far side of the specimen. After development procedure, these areas are rinsed in distilled water and then dried using compressed nitrogen gas flow. Auxiliary aluminium layer (6) with a thickness of 100-200 nm is evaporated on photoresist using vacuum deposition. Then a single layer of PMMA (7) is spin coated on the top of aluminium layer at 2000-3000 rpm for 40 seconds and dried for 5 minutes at 150° C. on hotplate. PMMA layer thickness depends on viscosity and can vary from about 150 to 400 nm. Precise alignment and angle correction between the dot-matrix and electron beam patterning areas is done with a Raith e_LiNe scanning electron microscope, using dot-matrix patterned and developed alignment marks (8) that are placed on the far side of specimen (wafer coordinate system is aligned with the dot-matrix patterned area before electron beam exposure).

Figure 1:
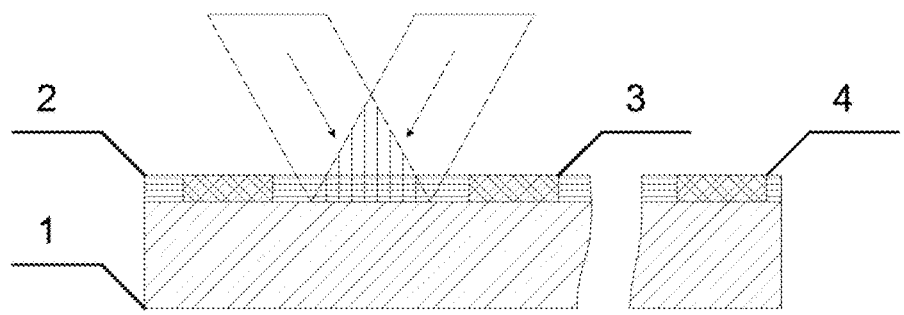
FIGS. 1-10 shows a method of producing an original hologram that allows the combination of dot-matrix laser and electron beam lithography techniques in a single resist layer using an aluminium interlayer.
Figure 2:
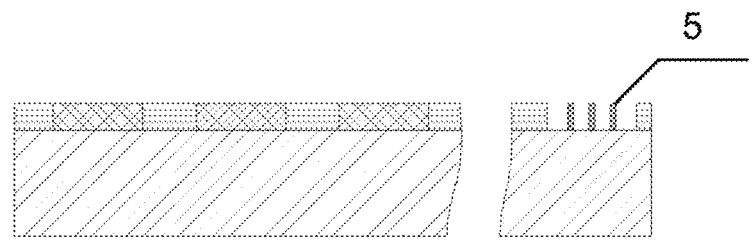
Figure 3:
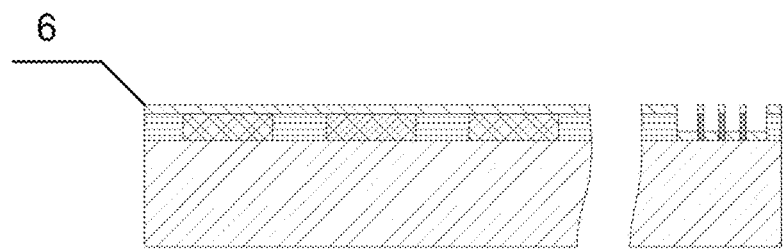
Figure 4:
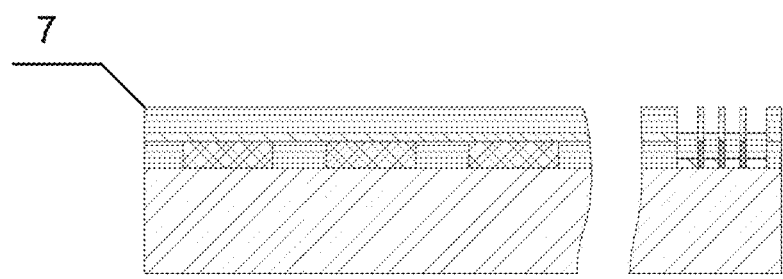
Figure 5:
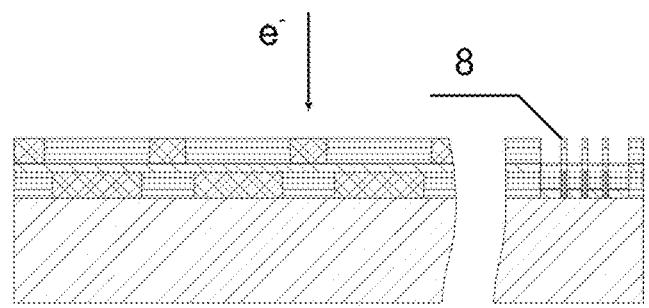
Figure 6:
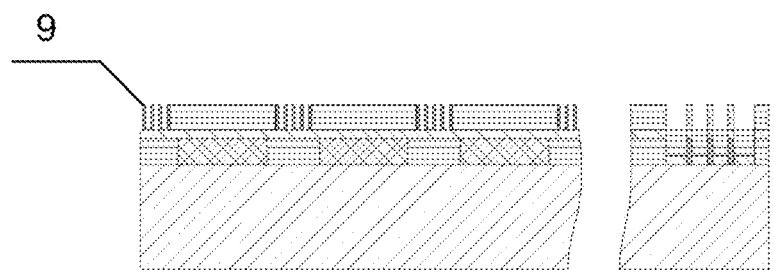
Figure 7:
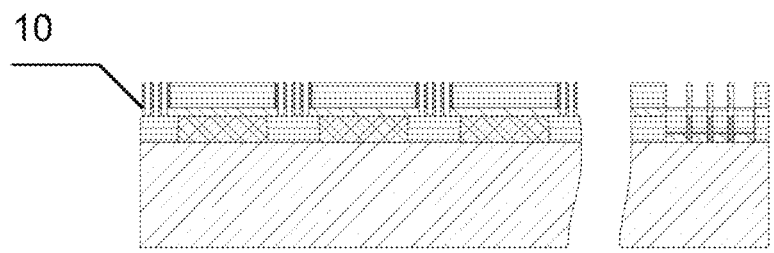
Figure 8:
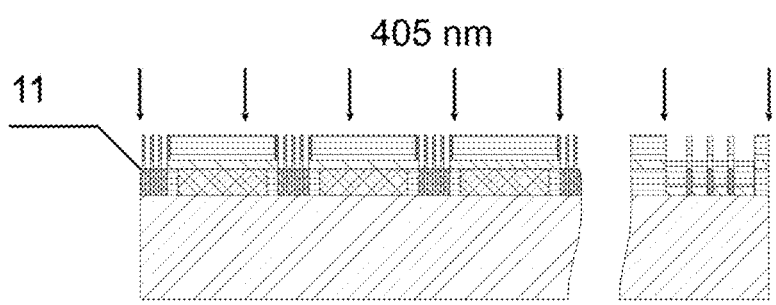
Figure 9:
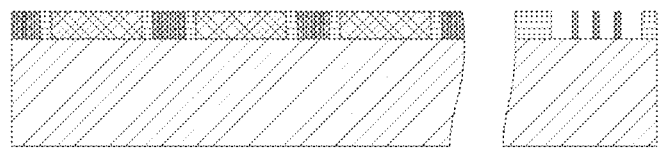
Figure 10:
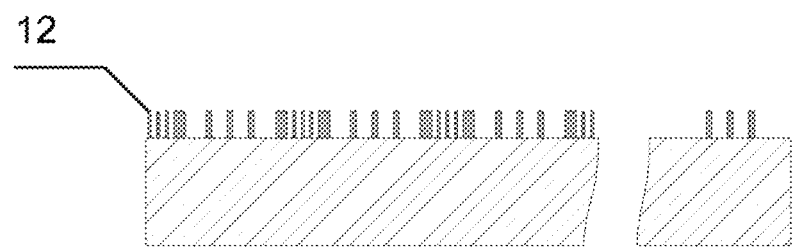
Figure 11:
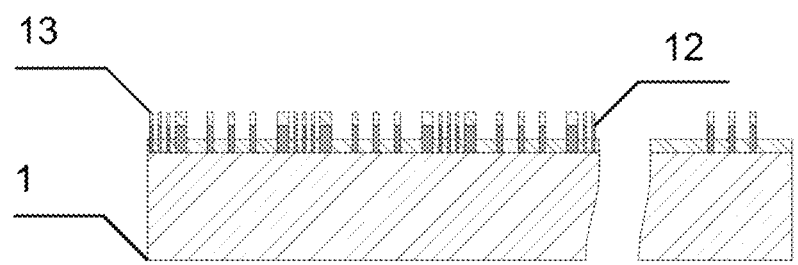
FIGS. 11-17 shows the formation of a multilayer polymeric film with a hologram using a single resist layer with dot-matrix and electron beam patterned and precisely aligned features.
Figure 12:
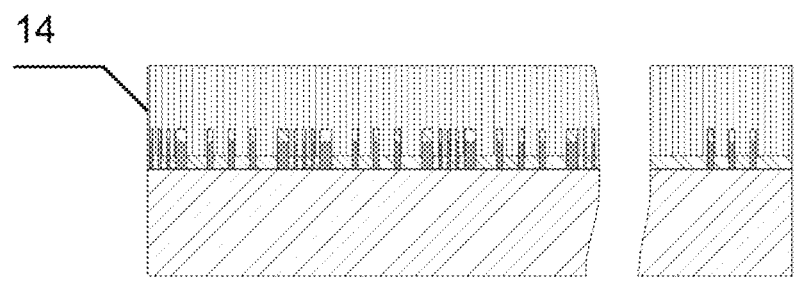
Figure 13:
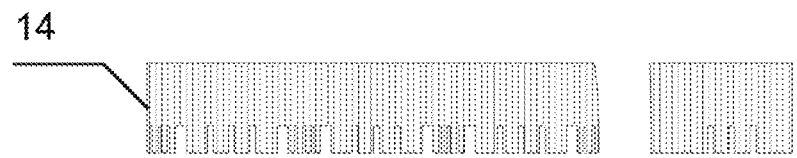
Figure 14:
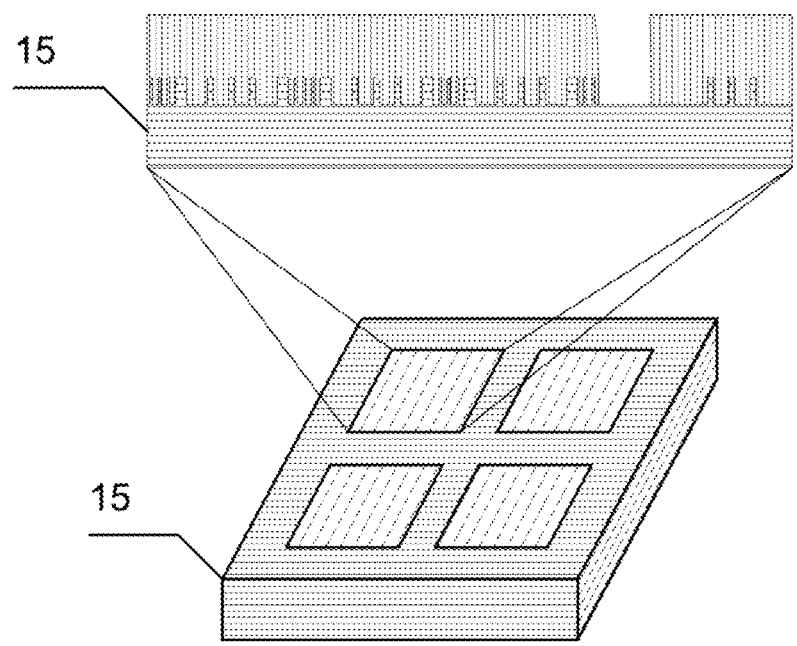
Figure 19:
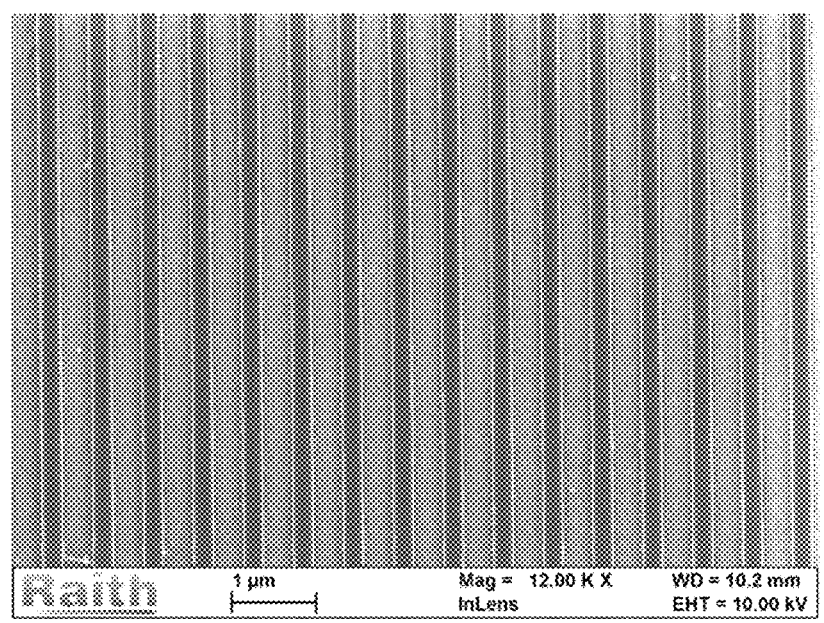
FIG. 19 shows diffractive optical elements.
Figure 20:
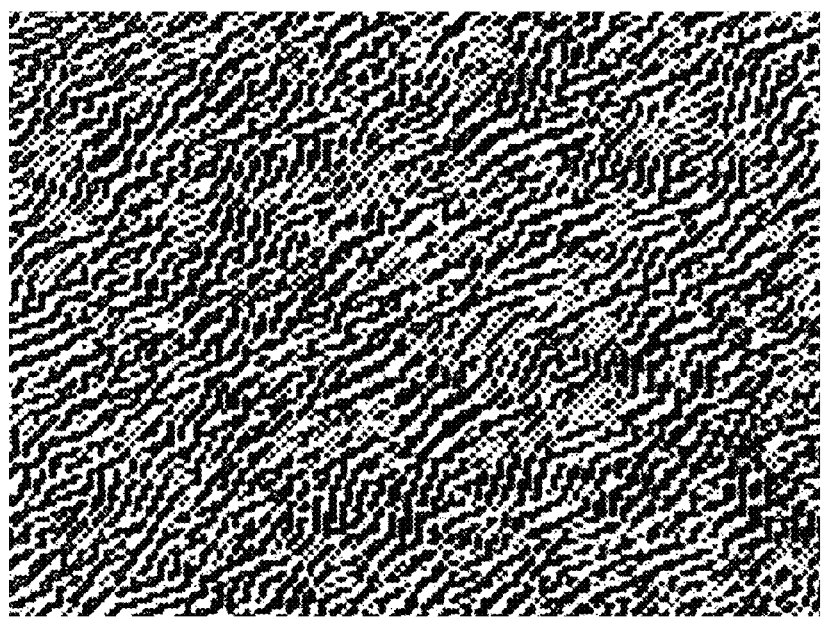
FIG. 20 shows structure of CGHs.

Efficient electron beam patterning, as shown in FIG. 5, is done with the Gaussian beam of 2 nm size provided by Raith e_LiNe electron beam lithography system. The system requires precise focusing and alignment procedures and exposure parameters usually are customized for specific application, e.g. exposing different parts of one design and changing column and other parameters in between. Column parameters such as beam voltage can be freely selected within the range from 20 V to 30 kV in steps of 10 V. The working distance can also be freely adjusted. Seven beam defining aperture settings are easily selected through the software interface. The apertures are changed electromagnetically providing a current range from 5 pA to approximately 20 nA. The wide selection of available parameters ensures efficient PMMA patterning with a wide range of dose variation to form a variety of diffractive optical elements, as shown in FIG. 19, as well as Computer Generated Holograms. CGH is a diffractive optical beam shaping element used to transform the transverse power distribution of a laser beam incident upon it into a desired transverse power distribution. The structure of CGHs, as shown in FIG. 20, can be calculated by several different methods included, but not limited to, Detour Phase algorithm, Gerchberg-Saxton algorithm, Wavefront Recording Plane algorithm, Kinoform algorithm, Fourier Ping-Pong algorithm, Coherent Raytrace algorithm and Diffraction-Specific algorithm. Development of the exposed PMMA 9) is done in MIBK-IPA solution, ratio 1:3, for 40 seconds with agitation. Then development is stopped in IPA for 15 seconds. Ceric ammonium nitrate-based etchant $Ce(NH_4)_2(NO_3)_6:HNO_3$ with etch rate of 40 Å/sec, at room temperature, is used for etching of the aluminium film followed by deionized water rinse. After wet chemical etching of the aluminium film (10) and soft baking on a hotplate at 90° C. for 1 min, the photoresist is exposed by mercury lamp with 32 mW/cm$^2$ light intensity in OAI Model 200 mask aligner through the openings in the aluminium layer (11). The typical exposure time is equal to 10 seconds. Then PMMA is lifted off together with aluminium layer, as shown in FIG. 9, in ultrasound bath using ceric ammonium nitrate-based etchant. The final development of the photoresist in the dot-matrix laser and electron beam patterned areas is done using a Microposit® MF-26A developer for 20 seconds at room temperature immersing whole specimen. After development procedure, whole specimen with a developed photoresist pattern (12) as shown in FIG. 10, is rinsed in distilled water and then dried using compressed nitrogen gas flow.

Figure 15:
Figure 16:
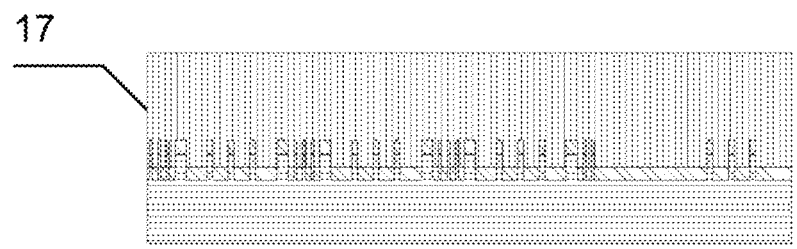
Figure 17:
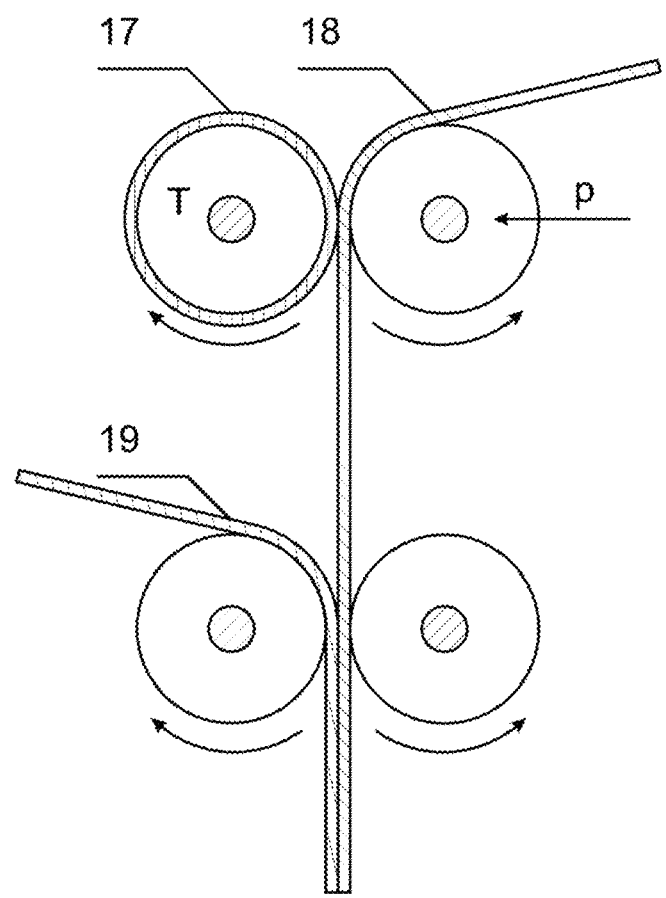

FIGS. 11-17 show the formation of a multilayer polymeric film with a hologram using a single resist layer with dot-matrix and electron beam patterned and precisely aligned features. Vacuum evaporation technique is used to form electroconductive silver layer (13) with thickness of about 40 nm on the surface of the glass substrate (1) with a patterned PMMA layer (12). During the vacuum evaporation, residual gas pressure in the vacuum chamber is about $p=2\times10^{-4}$ Pa and the substrate temperature is T=20° C. The electrochemical deposition of nickel (14) is carried out from mechanically agitated nickel sulphamate at T=50±1° C. Boric acid is used as a buffering agent to stabilize pH value of the electrolyte in the range from 3.8 to 4.2 (optimal value is 4.0). Sodium dodecyl sulphate is used as an antipitting agent. The titanium basket filled with the Nickel S-Rounds (by INCO) and coated with a polypropylene fabric is used as an anode. The cathode current density is 10 mA/cm$^2$ during the first 15 min of electrolysis and later is smoothly increased up to 35 mA/cm$^2$ for the remaining time of electrolysis. The final thickness of the electrodeposited layer is about 90 μm and the average deposition rate is approximately 37 μm/h. After the electrodeposition Ni film (14) is detached from the PMMA surface and is washed with warm water. Ni film with a mirror image of dot-matrix and electron beam patterned hologram is then used for the recombining process in order to obtain a single nickel master shim. The main requirement for hologram recombining equipment is to ensure precision contact across the entire embossing area. Recombining quality during embossing is dependent on the quality of the operating elements of the device and the technological parameters (temperature, pressure, processing duration and positioning accuracy). Recombining accuracy is achieved using a device with precision head and coordinate table. The material of the head is chosen in such a way that the surface properties and volume dimensions are constant during embossing process. Recombining is performed by embossing a hologram on a surface of PMMA plate (thickness of plate is 3-5 mm) 14 (15)). Embossing is done at temperature of T=150-165° C., pressure p=0.3-07 MPa and duration t=13-17 s. The size of recombining area can vary in wide range depending on the embossing roll width and radius. PMMA plate with the embossed holograms is coated with the electroconductive silver layer (16) with thickness of about 40 nm using vacuum evaporation technique at residual gas pressure in the vacuum chamber $p=2\times10^{-4}$ Pa and the substrate temperature equal to T=20° C. Silver coated PMMA plate is immersed into the nickel sulphamate bath in order to produce a nickel master shim (17). The electrochemical deposition of nickel is carried out from mechanically agitated nickel sulphamate at T=50±1° C. Boric acid is used as a buffering agent to stabilize pH value of the electrolyte in the range from 3.8 to 4.2 (optimal value is 4.0). Sodium dodecyl sulphate is used as an antipitting agent. The titanium basket filled with the Nickel S-Rounds (by INCO) and coated with a polypropylene fabric is used as an anode. The cathode current density is 10 mA/cm$^2$ during the first 15 min of electrolysis and later is smoothly increased up to 35 mA/cm$^2$ for the remaining time of electrolysis. The final thickness of the electrodeposited layer is about 90 μm and the average deposition rate is approximately 37 μm/h. After the electrodeposition Ni master shim (17) is detached from the PMMA surface and is washed with warm water. Then Ni master shim is fitted to the glass plate and procedure of the Ni electrochemical deposition, as shown in FIGS. 15-16, can be repeated many times in order to fabricate Ni shims for roll-to-roll replication of holograms in polymer film. The Ni shim (17) is fixed on a heated roller in an embossing machine. Under controlled pressure of p=0.1-0.5 MPa and temperature of T=65-82° C., a second roller presses the transparent or metalized film into the shim (18). Type of the multilayer film depends on the application of the final product. Simple PET or tamper evident film with thickness of 19-54 µm can be applied for the stickers production. Multilayer film with the thickness of 19-24 µm can be used for hot stamping applications. For stickers production a pressure sensitive adhesive layer with thickness of 10-25 µm is coated and sandwiched with silicone paper (19). Then different types of cutting devices, like plotters, cutting machines, etc., can be used to get required size and shape of the stickers. Very thin adhesive layer, around 1-5 µm thick, is coated for hot stamping applications. Different types of commercial water based or solvent based adhesives can be used. Coating regimes are chosen depending on nature and viscosity of adhesive. For coating of high viscosity adhesives annilox rolls equipped with knifes can be used in order to ensure smooth and even distribution of the thin adhesive layer on the surface of polymer film. In case of low adhesive viscosity wire rods for adhesive layer formation can be used. Thickness of adhesive layer depends on adhesive viscosity and wire diameter. After drying of the adhesive layer the film is scrolled and is ready for hot stamping applications. Hot stamping procedure is performed using a device equipped with heated stamp which shape is chosen with respect to the final product. Hot stamping is usually done at T=80-100° C., pressure p=0.01-0.05 MPa.

Although numerous characteristics and advantages together with structural details and features have been listed in the present description of the invention, the description is provided as an example fulfilment of the invention. Without departing from the principles of the invention, there may be changes in the details, especially in the form, size and layout, in accordance with most widely understood meanings of the concepts and definitions used in claims.

The invention claimed is:

1. A method of fabricating a holographic security label comprising steps of:
   dot-matrix laser patterning of a hologram and alignment marks in defined areas of an art design in a photosensitive layer of a specimen, wherein the alignment marks are positioned on a side away from the hologram;
   separately developing the alignment marks on the side of the specimen from the hologram;
   depositing in vacuum of auxiliary aluminum film with a thickness of 100-200 nm;
   spin coating of a single layer of Polymethylmethacrylate (PMMA);
   precisely performing alignment and angle correction between dot-matrix and electron beam patterning areas by a scanning electron microscope;
   patterning by focused electron beam;
   developing of PMMA;
   etching of the aluminum film using $Ce(NH_4)_2(NO_3)_6$: $HNO_3$;
   performing photoresist exposure ($\lambda$=405 nm);
   etching of the aluminum layer and lift-off of PMMA using $Ce(NH_4)_2(NO_3)_6$:$HNO_3$;
   developing of the photoresist thus fabricating aligned areas of dot-matrix and electron beam patterned holograms;
   depositing of a silver film in vacuum;
   depositing of a nickel film using electrochemical means;
   producing of a nickel shim for roll-to-roll replication;
   replicating the holograms in a multilayer metallized or transparent polymer film; and
   coating the film with pressure-sensitive, thermoplastic or thermosetting adhesive and dividing the film into individual labels.

2. The method according to claim 1, wherein the dot-matrix laser pattern and electron beam pattern designs are combined in one photosensitive layer using an intermediate aluminum layer wherein the dot-matrix laser pattern and electron beam pattern areas are precisely aligned using the scanning electron microscope.

3. A holographic security label obtained according to the method of claim 1.

* * * * *